United States Patent [19]

Kikuchi

[11] 4,054,866

[45] Oct. 18, 1977

[54] CONVERSION ELEMENT AND SYSTEM UTILIZING MAGNETIC BUBBLES

[75] Inventor: Yoshiki Kikuchi, Ebina, Japan

[73] Assignee: Fuji Xerox Co., Ltd., Tokyo, Japan

[21] Appl. No.: 695,315

[22] Filed: June 11, 1976

[30] Foreign Application Priority Data

June 25, 1975   Japan .................................. 50-77558

[51] Int. Cl.$^2$ ............................................. G11C 19/08
[52] U.S. Cl. ............................................. 340/174 TF
[58] Field of Search ................................ 340/174 TF

[56] References Cited

U.S. PATENT DOCUMENTS

| | | | |
|---|---|---|---|
| 3,526,883 | 9/1970 | Tabor | 340/174 TF |
| 3,798,622 | 3/1974 | O'Dell | 340/174 TF |

OTHER PUBLICATIONS

AIP Conference on Magnetism & Magnetic Materials - Dec. 3-6, 1974, S. F. Cal. pp. 620-621.

AIP Conference on Magnetism & Magnetic Materials - Dec. 3-6, 1974, S. F. Cal. pp. 622-623.

*Primary Examiner*—James W. Moffitt
*Attorney, Agent, or Firm*—Gerald J. Ferguson, Jr.; Joseph J. Baker

[57] ABSTRACT

A conversion element and system comprising a magnetic thin plate capable of having magnetic bubbles formed therein; and at least two conductive segment patterns disposed adjacent the magnetic thin plate, each pattern comprising a plurality of conductive segments, each conductive segment including switching means therein and having outward and return lines parallel to each other, the plurality of conductive segments of each conductive segment pattern being aligned parallel to one another so that the spacing between any two adjacent conductive segments thereof is smaller than the space between the outward and return lines, and the two conductive segment patterns being disposed with respect to one another so as to form a lattice shape on the magnetic thin film.

5 Claims, 11 Drawing Figures

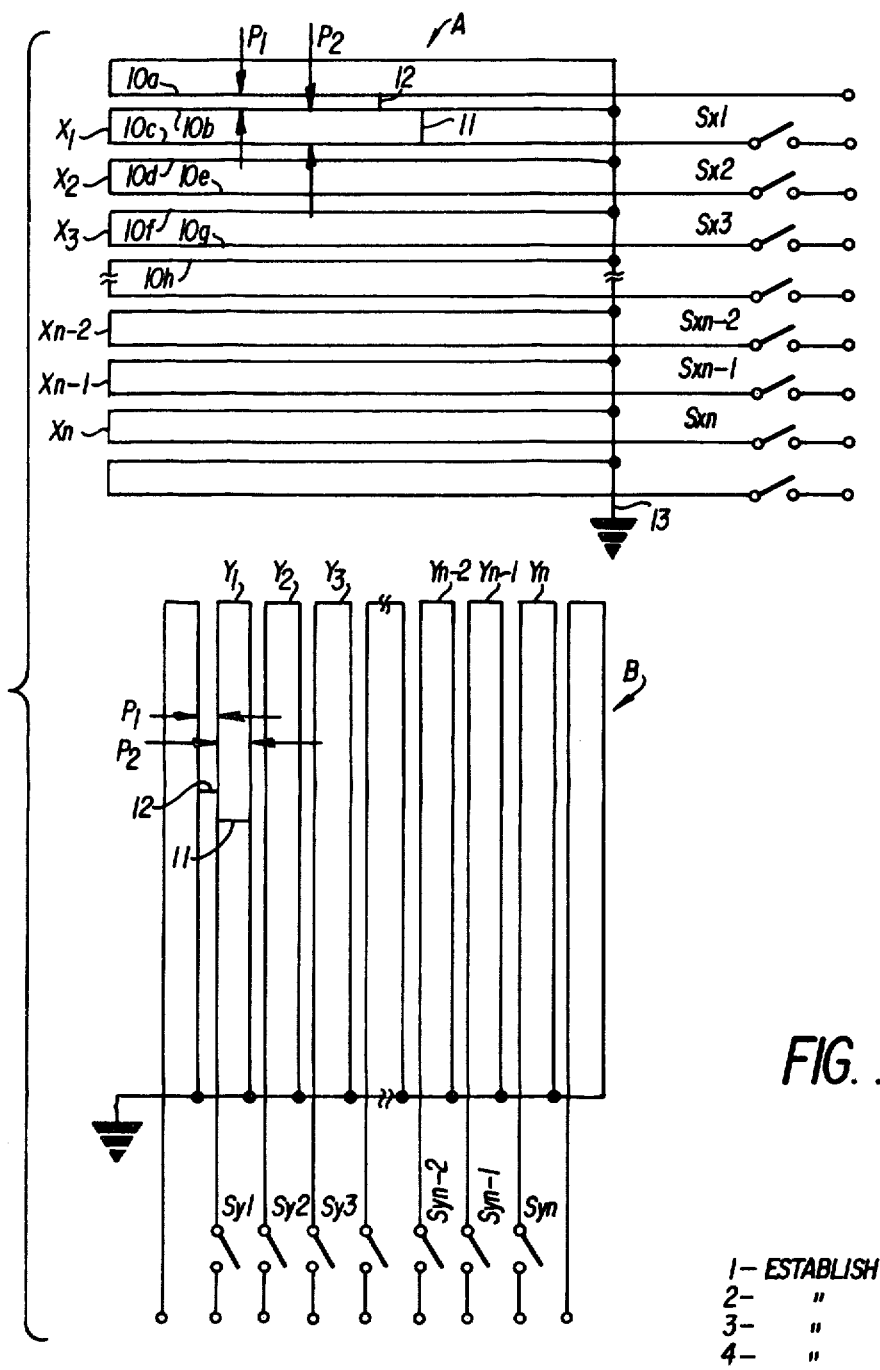
1 — ESTABLISH SEED BUBBLES
2 — " STRIP DOMAINS
3 — " INSULAR DOMAINS
4 — " MAGNETIC BUBBLES
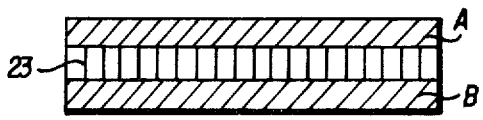
FIG. 2
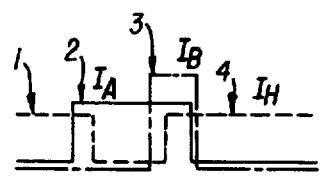
FIG. 3

| | |
|---|---|
| 1 - ESTABLISH SEED BUBBLES | |
| 2 - " STRIP DOMAINS | |
| 3 - " INSULAR DOMAINS | |
| 4 - " MAGNETIC BUBBLES | |

CONVERSION ELEMENT AND SYSTEM UTILIZING MAGNETIC BUBBLES

RELATED APPLICATION

This application is related to a U.S. application entitled "Improved Image Pickup Element and System Utilizing Magnetic Bubbles" filed by Yoshiki Kikuchi on Dec. 3, 1975 and assigned Ser. No. 637,141, which is hereby incorporated herein by reference.

BACKGROUND OF THE INVENTION

This invention relates to a conversion element using a magnetic bubble matrix for converting to a magnetic bubble pattern an electrical signal representing letters or images which are transmitted from an output in series or in parallel.

SUMMARY OF THE INVENTION

A primary object of this invention is the provision of a conversion element using a magnetic bubble matrix wherein the matrix is formed by applying an external bias magnetic field to a thin plate of a magnetic bubble material in a direction vertical to the plate surface while applying a current to conductive segment patterns of a suitable form without employing known magnetic bubble-generating circuit to thereby produce magnetic bubbles in the form of a matrix collectively and simultaneously. The current flowing through the conductive segment patterns may then be controlled in accordance with a series electric signal of image information such as letters or figures to selectively erase certain ones of the magnetic bubbles of the magnetic bubble matrix to obtain a magnetic bubble pattern corresponding to the image information. The diameter of the once formed magnetic bubbles can be enlarged so as to yield a clear image.

Other objects and advantages of the invention will be apparent from the following description, which, taken in connection with the accompanying drawings, discloses preferred embodiments thereof.

BRIEF DESCRIPTION OF THE DRAWING

FIG. 1 is a plan view of two illustrative conductive segment patterns in accordance with the invention.

FIG. 2 is a schematic view, in section of an illustrative conversion element utilizing the conductive segment pattern of FIG. 1.

FIG. 3 is a diagram showing illustrative pulse timing for producing a magnetic bubble matrix.

DETAILED DESCRIPTION OF THE PREFERRED EMBODIMENTS OF THE INVENTION

Figure 4:
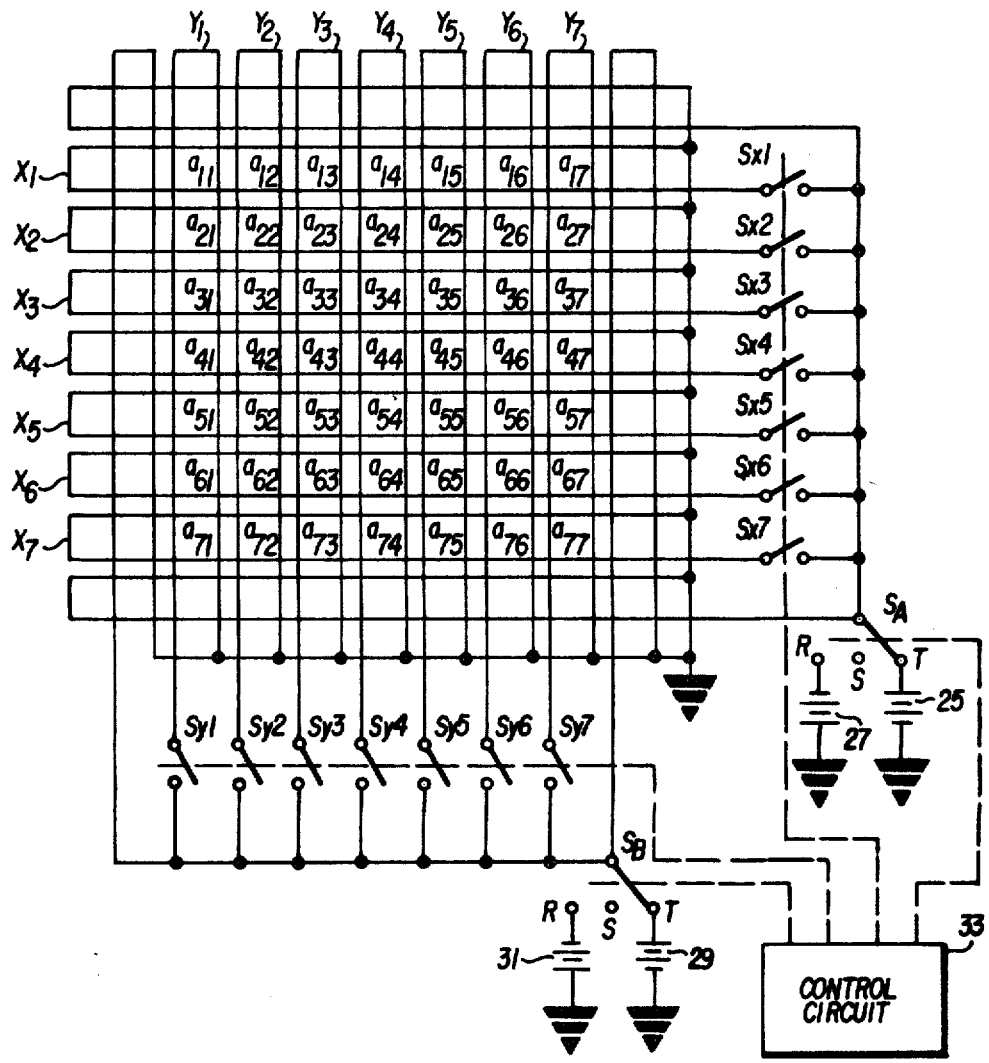
FIG. 4 is a plan view of the conductive segment patterns of FIG. 1 in lattice form.

Referring to the drawings, FIG. 1 is a view showing a conductive segment pattern A composed of a plurality of conductive segments, $X_1 - X_n$, arranged in a horizontal direction and a conductive segment pattern B composed of a plurality of conductive segments, $Y_1 - Y_n$, arranged in a longitudinal direction. A magnetic bubble material 23 is preferably inserted between the conductive segment patterns A and B to form a sandwich structure as shown in FIG. 2. Further, the pair of orthogonal conductive segment patterns A and B may have an insulating layer inserted between them so that they may be disposed on only one side of the magnetic bubble material 23. The segments $X_1 - X_n$ and $Y_1 - Y_n$ constituting the conductive segment patterns A and B, respectively, are each composed of an outward and a return line, the outward lines being connected to switches $Sx_1 - Sx_n$ and $Sy_1 - Sy_n$, respectively, and the return lines being grounded. A space 11 (wide pitch portion $P_2$) between the outward and return line of each of the conductive segments $X_1 - X_n$ and $Y_1 - Y_n$ is designed to be about 2 - 3 times as large as a diameter of a magnetic bubble. While, a space 12 (narrow pitch portion $P_1$) between any two adjacent conductive segments of the segments $X_1 - X_n$ and $Y_1 - Y_n$ is approximately equal to a diameter of the magnetic bubble.

In operation, when all of the switches $Sx_1 - Sx_n$ are switched to the "ON" position, an approximately equal direct current flows through the conductive segments $X_1 - X_n$, respectively. As a result, a magnetic field is established in space 11 of FIG. 1 in a direction vertical to the space and, similarly, a magnetic field is created in space 12 in a direction opposite to the direction of the magnetic field in space 11.

In this specification and the following claims, a magnetic bubble denotes a cylindrical magnetic domain existing under a bias magnetic field exerted in the direction perpendicular to the surface of a thin film of suitable magnetic material such as rare earth orthoferrite, plumbite or rare earth iron-garnet. Various properties of magnetic bubbles are discussed in "Properties and Device Applications of Magnetic Domains In Orthoferrites" by A. H. Bobeck, The Bell System Technical Journal, Vol. XLVI, No. 8, October, 1967, pp. 1901-1925 and "Propagation of Cylindrical Magnetic Domains in Orthoferrites" by Anthony J. Perneski, IEEE Transactions on Magnetics, Vol. Mag - 5, No. 3, September, 1969. The magnetic bubble diameter changes with film thickness, bias magnetic field intensity or temperature, and the magnetic field intensity for annihilating the magnetic bubbles is fixed when film thickness and temperature are defined.

As an example of the magnetic materials usable in the present invention, samarium-terbium mixed orthoferrite ($Sm_{0.55}Tb_{0.45}FeO_3$) is available. In a magnetic bubble device, it is known from BSTJ, Dec., 1969, p. 3287-3335 that the properties of a magnetic bubble can be represented, in a normalized form, by the characteristic material length l, the thickness h and the saturation magnetization $4\pi Ms$ and these properties do not change although the magnetic material is changed.

In the article "Temperature Dependence of Rare-Earth Orthoferrite Properties Relevant to Propagating Domain Device Application" by Rossol, IEEE Transaction on Mag., Vol. MAG-5, No. 3, September, 1969, it is shown that at room temperature (300° K), the magnetic bubble domain properties for Sm-Tb mixed orthoferrite thin film are as follows, when the thickness of the thin film is about 40μ: the diameter of magnetic bubble under a bias magnetic field, $H_{bias}$, of 58 Oersteds is about 30μ and the magnetic bubble collapse field, $H_{co}$, and the magnetic bubble strip-out field, $H_s$, are 64 Oersteds and 50 Oersteds, respectively. This means that when the bias magnetic field becomes higher than 64 Oe and lower than 50 Oe, the magnetic bubbles existing in the magnetic thin film collapse and strip out respectively. The effects of the magnetic bubbles collapsing and stripping out are also caused by local increase and decrease of the bias magnetic field in the magnetic thin film.

When a pair of bubbles coexists with a small distance therebetween, an expelling force interacts on both bubbles. When the distance between the bubbles is larger than $3d$ where $d$ is the diameter of a bubble, the bubbles are less effected by translational forces. Therefore, by setting the bias field, $H_{bias}$, to 58 Oe so that the diameter $d$ becomes 30μ and by selecting the distance between adjacent bubbles forming the bubble lattice as about $3d$, the sum of narrow pitch portion $P_1$ and wide pitch portion $P_2$ of pattern A would be $3d$. $P_1$ and $P_2$ would be 30μ and 60μ, respectively. In this case, the width of the conductive segment would be determined as 15μ according to Goldstein et al. "Bubble Forces in Cylindrical Magnetic Domain Systems." J. Appl. Phys. Vol. 44, No. 11, November, 1973 where it is, in effect, stated: if the conductor's width is less or equal to a magnetic bubble radius, the force on a magnetic bubble from a conductor pattern may be approximated by zero width connected current carrying segments.

Figure 5:
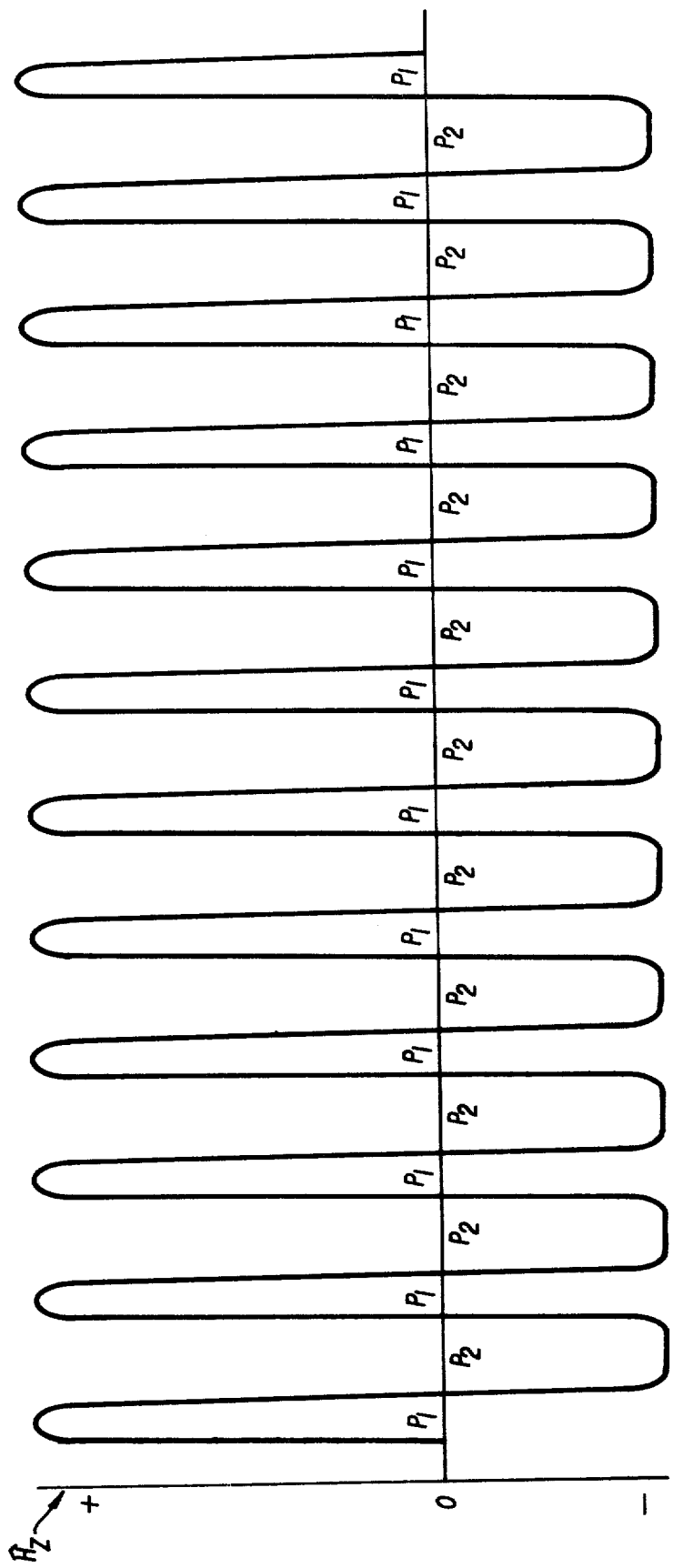
FIG. 5 is a magnetic field distribution in a magnetic thin film produced by application of current pulses to the conductive segment patterns of FIG. 1.

In the image display element according to the present invention, conductive segment patterns A and B such as shown in FIG. 1 may be provided on both sides of a magnetic thin film in an orthogonal relationship with each other as shown in FIG. 4 to form a lattice structure. The conductive segment pattern A is connected through switches $Sx_1 - Sx_7$ and a switch $S_A$ to either battery 25 or battery 27. The conductive segment pattern B is connected through switches $Sy_1 - Sy_7$ and a switch $S_B$ to either battery 29 or battery 31. Switches $S_A$ and $S_B$ are triplethrow, single pole switches each having contacts $r$, $s$, and $t$. Switches $S_A$, $S_B$, $Sx_1 - Sx_7$, and $Sy_1 - Sy_7$ are under the control of a control circuit 33. As will be explained in further detail hereinafter, when currents are applied to the conductive segment patterns A or B, a magnetic field configuration corresponding to the pattern is produced as shown in FIG. 5. Each conductive segment pattern comprises a plurality of parallel conductor elements 10a, 10b, 10c, 10d, 10e, 10f, 10g, 10h, . . . , the pitch between successive elements alternately being $P_1$ and $P_2$ where pitch $P_2$ is substantially greater than pitch $P_1$, as can be seen in FIG. 1. Since each conductive segment is cyclical having narrow-pitch portion $P_1$ and wide-pitch portion $P_2$, a striped mean magnetic field configuration, which is produced by one conductor pattern and is perpendicular to the surface of the magnetic thin film, intersects a striped mean magnetic field configuration in the orthogonal direction generated by the other conductor pattern to produce insular magnetic fields in the magnetic thin film corresponding to the overlapped portions of the wide pitch portions $P_2$ of the two conductive segment patterns A and B. As will be explained in detail hereinafter, the magnetic fields have superimposed thereon a bias field to establish the magnetic-bubble lattice. The conductive segment pattern may be formed on a substrate such as glass by using etching techniques. The resultant pattern may then be placed on the upper and lower surfaces of magnetic thin film 23 in intimate contact therewith. Thereafter, when an electric current is applied thereto a magnetic field is produced in the magnetic thin film.

FIG. 5 shows an illustrative magnetic field distribution in film 23 with a current flowing through conductive segment pattern A or B. The vertical axis is the magnetic field component Hz in a direction normal to the film surface, averaged with respect to the film thickness. In FIG. 5 the direction of the bias magnetic field is defined as the plus direction. The peak values of the magnetic fields produced in the respective narrow and wide pitch portions $P_1$ and $P_2$ are +73oe and −41 oe, respectively, when a current of one ampere flows through conductive segment pattern A or B. That is, the intensity of the magnetic field produced in the narrow pitch portion $P_1$ is about 1.8 times as great as that produced in the wide pitch portion $P_2$. The bias magnetic field range within which the bubble is stabilized is from the strip-out magnetic field (= 50 oe) to the bubble collapse magnetic field (= 64 oe). Within this range the bubble diameter decreases with increasing bias magnetic field. The direction of the bias magnetic field $H_{bias}$ is shown as coming upwardly through the paper sheet in FIG. 6. In this case, the upper portion and the lower portion of the bubble in the magnetic film become S and N poles respectively.

The method of producing a magnetic bubble matrix or lattice will now be described with reference to FIGS. 6 – 10. First, referring to FIG. 6, a bias magnetic field of +58 oe, which is within the bubble stabilizing range, is applied to the magnetic thin film 23 in a direction normal to the surface by a bias field source 35 such as a Helmholtz coil to set up seed bubbles in end areas of the wide pitch portion $P_2$ of the conductive segment pattern A, where the switches are in the positions shown in FIG. 6. A simple method of setting up seed magnetic bubbles is as follows: magnetic bubbles can be observed visually utilizing the magneto-optic effects — that is, for example, when linear polarized light vertical to the plane of the thin film of the magnetic bubble material is transmitted through or reflected, the plane of the linear polarized light rotates clockwise or counterclockwise depending on the direction of the magnetization in the thin film of the magnetic bubble material. Therefore, the magnetic bubbles which are formed by bias magnetic field application can be guided by means of a magnetic north pole needle capable of attracting magnetic bubbles to the seed-magnetic-bubble-positions. As to the stabilization of the seed bubbles, it is advisable to provide a thin film (5000A-1μ) of highly permeable magnetic material on the magnetic bubble film by etching at the seed bubble positions shown in FIG. 6 to thereby provide bubble stabilizing positions on the magnetic bubble film. These are shown as four permalloy dots in "Theory of Single - Current Domain Propagation Circuits" by Copeland, IEEE Trans. on Mag., Letters. June (1972) pp. 241-243. It is also described in "Application of Orthoferrites to DomainWall Devices" by Bobeck et al., IEEE Trans. on Mag., MAG-5, No. 3, Sept. 1969, that with the presence of a magnetic bubble in the stabilizing position, the bubble collapse magnetic field becomes larger than that required to collapse a free bubble by a few Oersteds.

Figure 7:
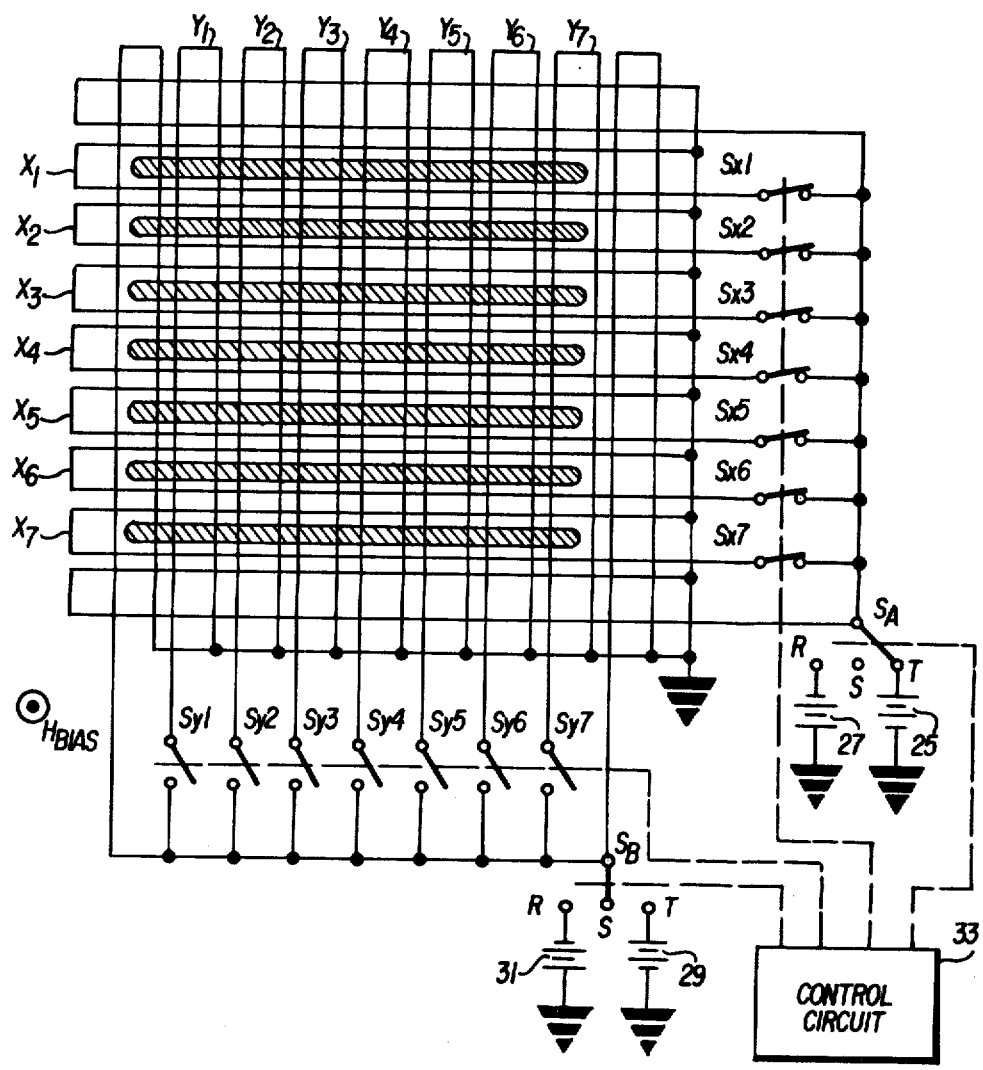
FIG. 7 is a plan view corresponding to FIG. 4 showing an illustrative production of strip domains from the seed bubbles of FIG. 6.

After the seed bubbles are set up, a current pulse of about 0.5 amperes is applied to each of the conductors of the conductive segment pattern A by actuating switches $S_A$ and $Sx_1 - Sx_7$ as indicated in FIG. 7. Due to the current pulse, the magnetic field distribution shown in FIG. 5 is produced in the magnetic thin film. In this case, the magnetic field produced in the wide pitch portions $P_2$ of conductive segment pattern A has a direction opposite to that of the bias magnetic field (+58 oersteds). Therefore the resultant magnetic field in these portions becomes +38 oersteds because the magnetic field due to the 0.5 ampere current in wide pitch portions $P_2$ is −20 oersteds. Since the strip-out magnetic field $H_S$ is 50 oersteds, the resultant magnetic field is smaller than the stripout field. Therefore, the seed bubbles are stripped out or extended to the area in the magnetic thin film 23 corresponding to wide pitch portions $P_2$ of conductive segment pattern A, as shown in FIG. 7. Since the magnetic field of the narrow pitch portion $P_1$ of the conductive segment pattern A is as same as that of the bias magnetic field, the strip out domains don't trespass on the portions in the magnetic thin film corresponding to the narrow pitch portions $P_1$ of the conductive segment pattern A. The distance the stripped-out domain extends depends upon the height and width of the current pulse flowing through the conductive segment pattern A. The distance required for a 11 × 11 bubble lattice would be about 1 mm where the wave height is 0.5 ampere and the width is $10^{-3} - 10^{-5}$ seconds. The pulse through conductive segment pattern A is shown at $I_A$ in FIG. 3.

Figure 8:
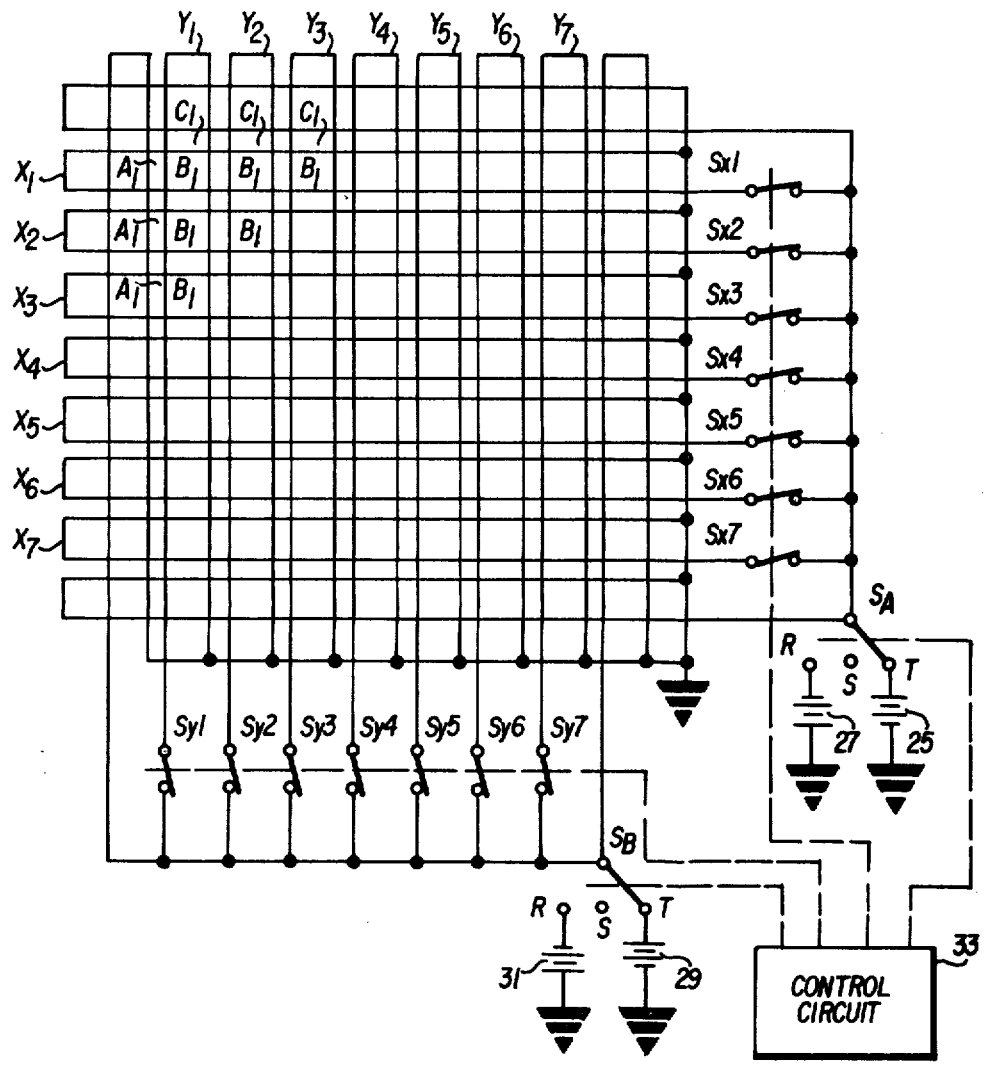
FIG. 8 is a plan view corresponding to FIG. 4 illustrating three areas thereof.
Figure 9:
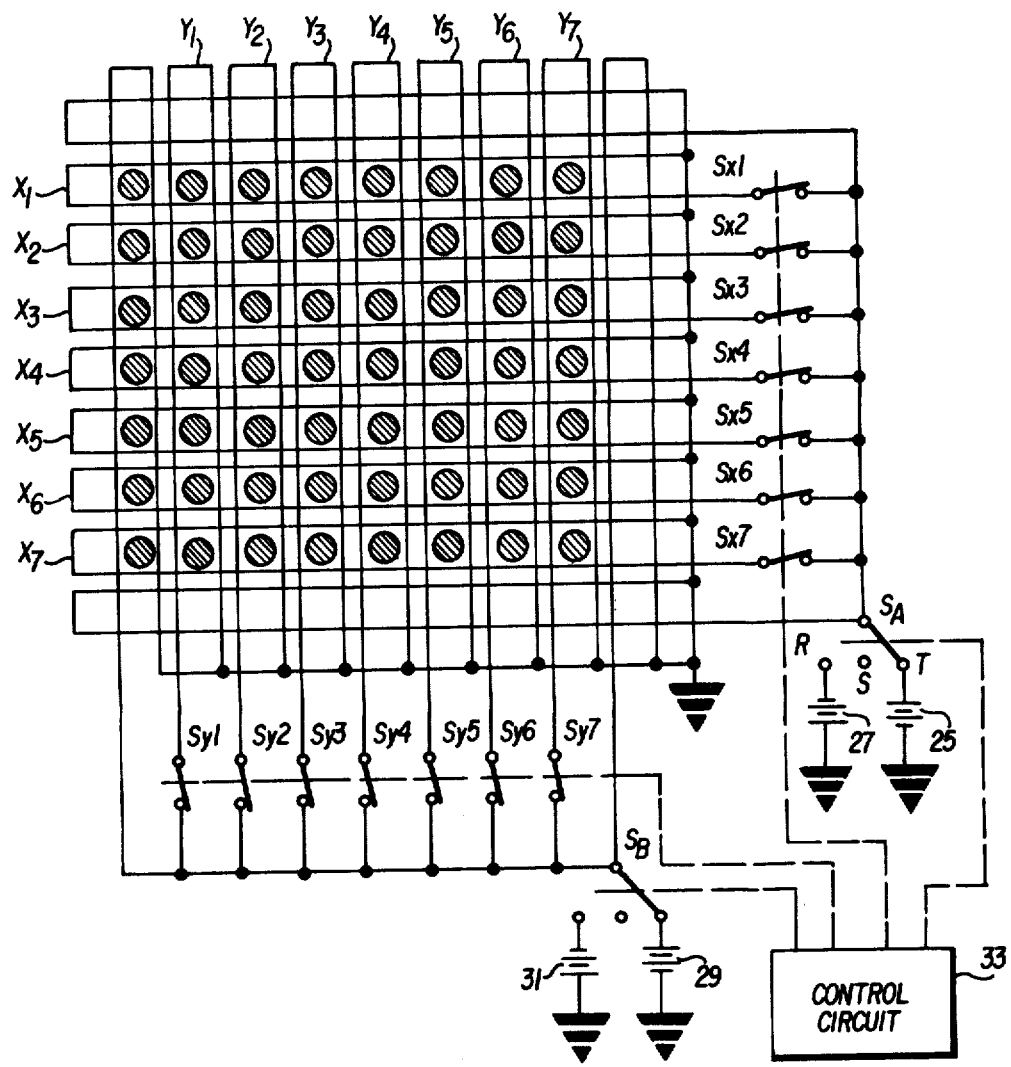
FIG. 9 is a plan view corresponding to FIG. 4 showing insular domains produced from the strip domains of FIG. 7 by dividing the latter.

After the strip domains are aligned as shown in FIG. 7, a current pulse is applied to each of the conductors of conductive segment B by actuating switches $S_B$ and $Sy_1 - Sy_7$ as indicated in FIG. 8. In a magnetic bubble device, new bubbles are made by dividing the seed bubbles as is well known. For samariumterbium mixed orthoferrite, it is shown in the article of Bobeck et al. that the bubble dividing magnetic field is +37.5 oersteds. The distribution of the magnetic field produced in the magnetic film by the current flowing through the conductive segment pattern B is as shown in FIG. 5. Since the patterns A and B are orthogonal, the distribution of the composite magnetic field becomes somewhat complicated. For explanatory purposes, overlapping portions of the two patterns are shown at portion $A_1$, $B_1$ and $C_1$. The portion $A_1$ is where wide pitch portions $P_2$ of the pattern A and narrow pitch portions $P_1$ of pattern B overlap; the portion $B_1$ is where wide pitch portions $P_2$ of the patterns A and B overlap; and portions $C_1$ is where narrow pitch portions $P_1$ of pattern A and wide pitch portions $P_2$ of pattern B overlap. The magnetic fields produced in the magnetic film portions corresponding to these overlapped portions by the currents flowing through patterns A and B are denoted by $H_A$, $H_B$ and $H_C$. When a current of 0.9 amperes flows through each of the conductors of patterns B, $H_A$ is obtained by subtracting 20 oersteds (the magnetic field produced in the wide pitch portions of pattern A) from 66 oersteds (the magnetic field produced in the narrow pitch portions of pattern B) and, therefore, is +44 oersteds. The latter is larger than the bubble dividing magnetic field, so that each of the aligned strip domains are cut at the respective $A_1$ portions thereby producing insular domains as shown in FIG. 9. The reason for that the insular domains are produced even when the bias magnetic field is applied, is that the magnetic field $H_B$ in the portions $B_1$ where the insular domains exist, becomes −57 Oe which substantially cancels the bias magnetic field therein. The magnetic field $H_c$ in the portion $C_1$ is substantially zero. Because the magnetic field of the narrow pitch portion $P_1$ of the conductive segment pattern A and the magnetic field of the wide pitch portion $P_2$ of the conductive segment pattern B are of the opposite direction and have approximately the same value, the bias magnetic field $H_{bias}$ is unaffected in this portion. The width of the current pulse flowing through the conductive segment pattern B is $10^3 - 10^{-6}$ seconds. After production of insular domains in the above manner, the currents flowing the conductive segment patterns A and B are cut off as indicated in FIG. 3 resulting in the magnetic bubble lattice or matrix shown in FIG. 10.

Figure 11:
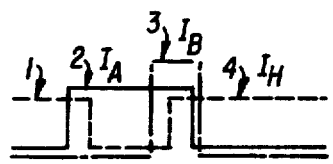
FIG. 11 is another diagram showing illustrative pulse timing for producing a magnetic bubble matrix.
Figure 6:
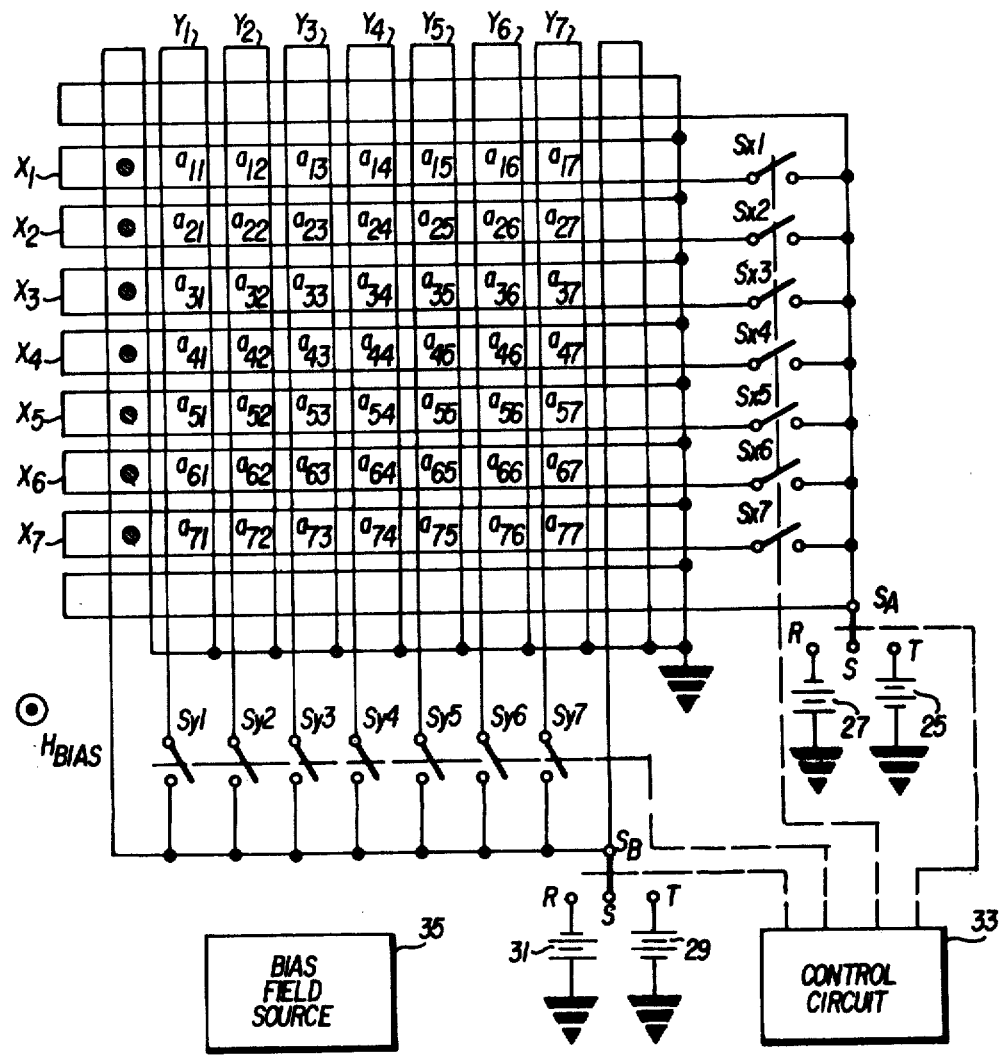
FIG. 6 is a plan view corresponding to FIG. 4 showing an illustrative setting of seed bubbles.

Another method which may be used for aligning magnetic strip domains is as follows: the current flows through the conductive segment pattern A, while the bias magnetic field, $H_{bias}$, is decreased to lower than the strip-out field, 50 Oe. Therefore the seed magnetic bubbles as shown in FIG. 6 strip out to the wide pitch portion $P_2$ of the conductive segment pattern A, following the magnetic field configuration of the corresponding portion in the magnetic thin film produced by the current flowing through the conductive segment pattern A, as shown in FIG. 5 because the direction of magnetization of the strip-out magnetic domain is as same as that of the magnetic field of the wide pitch portion $P_2$, but is opposite to that of the magnetic field of the narrow pitch portion $P_1$. Current pulses applied to the conductor patterns A and B would be adjusted as shown in FIG. 11. In FIG. 11, $I_A$ is a current pulse applied to conductive segment pattern A, $I_B$ is a current pulse applied to conductive segment pattern B, $I_H$ is a current pulse applied to a bias magnetic field source such as a Helmholtz coil. In this case that the bias magnetic field is decreased to zero, $I_A$ is substantially or slightly less than 0.5 amperes but $I_B$ is substantially or slightly greater than 0.9 amperes.

The number of lattice points, i.e., magnetic bubbles, in the magnetic bubble lattice may be readily increased. For example if the number of the conductive elements of conductive segment pattern is increased to 66, the active area of the lattice becomes about 3mm × 3mm and the magnetic bubble lattice is 32 × 32.

Although the above description refers to an embodiment where upper and lower pattern A and B sandwich the top and bottom surfaces of magnetic thin film 23, it is of course possible to attain the above results by a pair of orthogonal conductors patterns A and B having an insulating layer between them disposed on only one surface of the magnetic thin film 23.

Figure 10:
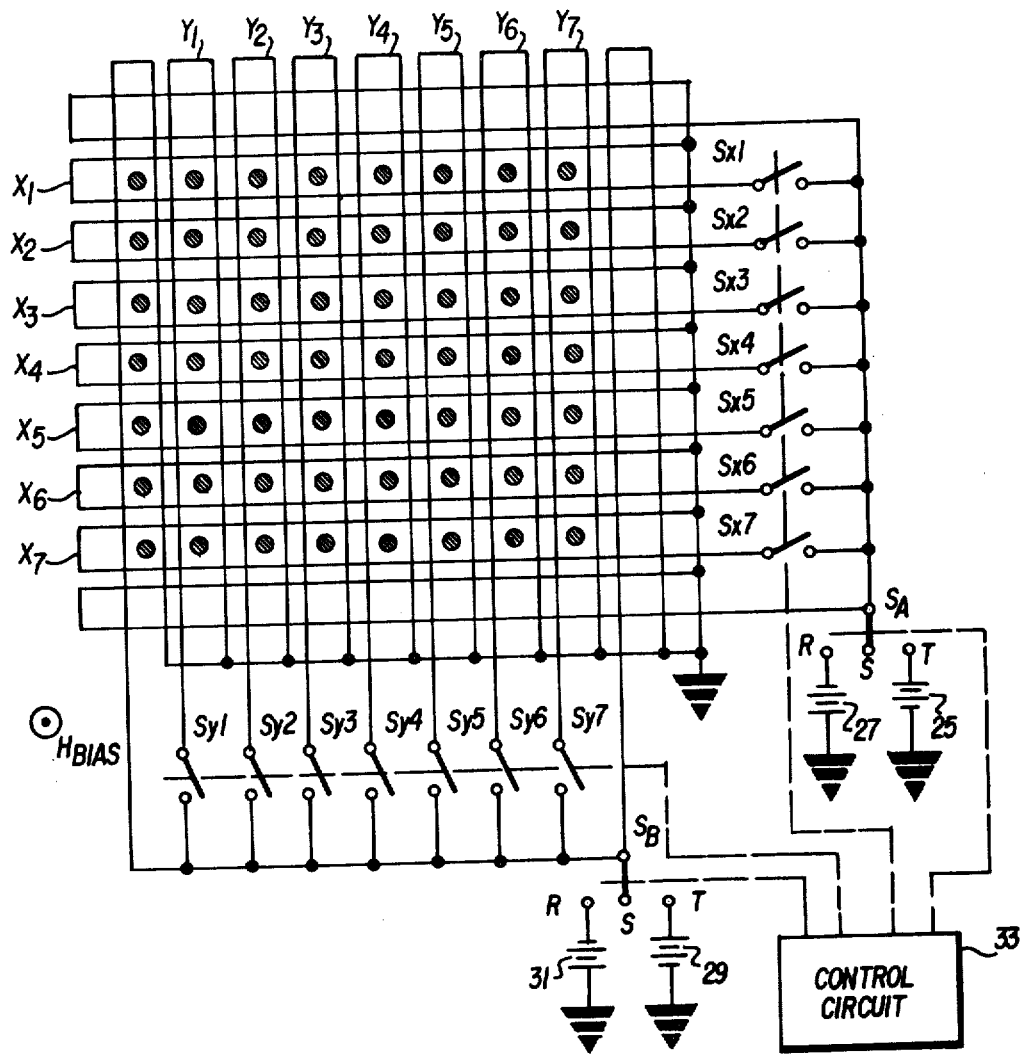
FIG. 10 shows a resultant, illustrative magnetic bubble lattice or matrix.

The magnetic bubble matrix FIG. 10 can be utilized to convert an electrical signal representative of a pattern such as a character or image to a magnetic bubble pattern corresponding to the character or image. In accordance with the invention, selected bubbles are extinguished by increasing the magnetic field therein to a value sufficient to effect bubble collapse. In order to do this the current flowing through the conductive segments surrounding the selected bubbles must be reversed with respect to that employed for formation of the magnetic bubble matrix. Thus, if the magnetic bubble in cell $a_{11}$ is to be extinguished, switches $S_A$ and $S_B$ must set to their R contacts and switches $Sx_1$ and $Sy_1$ must be closed. The magnetic field associated with the current flowing through the conductive segments, such as segment $X_1$ is denoted as $H_{cs}$. The cumulative magnetic field that results from currents flowing in overlapping segments such as segments $X_1$ and $Y_1$ is denoted as $\alpha H_{cs}$, where $\alpha$ may typically equal two. The bias magnetic field, which maintains the magnetic bubble matrix in the absence of additional magnetic fields is denoted as $H_{bias}$. The magnetic field needed to extinguish a magnetic bubble is denoted as $H_{co}$. The preferred relationship between the above quantities in accordance with the invention is $$H_{cs} + H_{bias} < H_{co} < H_{cs} + H_{bias}$$

where $\alpha = 2$. Thus, the resultant magnetic field in cell $a_{11}$ will be $H_{cs} + H_{bias}$ when current is applied only to segment $X_1$. This is less than the magnetic bubble collapse field $H_{co}$ and hence, the magnetic bubble remain; however, as soon as current is also applied to segment $Y_1$, the resultant field becomes $\alpha H_{cs} + H_{bias}$ whereby the magnetic bubble collapse field is exceeded and thus the magnetic bubble in $a_{11}$ is extinguished. For example, with a Sm-Tb mixed orthoferrite, $H_{cs}$ is 4 Oersteds, $H_{bias}$ is 58 Oersteds, $H_{co}$ is 64 Oersteds. The current flowing through the conductive segments, such as $X_1$ and $Y_1$ will be about 50 mili-amperes for the magnetic field of 4 Oersteds.

Note that in the illustration given above the magnetic bubble in cell $a_{21}$ will not be extinguished since switch $Sx_2$ is open at this time and since the magnetic field produced by the current through segment $Y_1$ (typically also equal to $H_{cs}$) is not large enough to extinguish the magnetic bubble even after it is superimposed on the bias magnetic field. Further, the magnetic bubble in cell $a_{12}$ will not be extinguished since $Sy_2$ is open at this time.

By leaving the switch $Sx_1$ closed for predetermined period of time, selected ones of the switches $Sy_1 - Sy_7$ can be closed either serially or in parallel to thus extinguish selected ones of the magnetic bubbles in cell $a_{11} - a_{17}$. The process can then be repeated after switch $Sx_1$ is opened and switch $Sx_2$ is closed. The above procedure can then be repeated for conductive segments $X_3 - X_7$ until a pattern of non-extinguished magnetic bubbles (that is, a magnetic bubble pattern) remains where the pattern corresponds to image information contained in electrical signals which would control the selective operation of switches $Sy_1 - Sy_7$ where all switches may, of course, be of the electronic type. The generation of a series of electrical pulses to represent an image or the like is well known and as such does not form a part of this invention.

The magnetic bubble pattern formed as described above can be readily converted into visible image by the use of magnetooptical effects — that is, for example, when linear polarized light vertical to the thin plate of the magnetic bubble material is transmitted through or reflected on the pattern, the plane of the linear polarized light rotates clockwise or counterclockwise depending on the direction of magnetization in the thin plate of the magnetic bubble material. Therefore, by using a polarizer and analyzer, the magnetic bubble pattern can be observed. When the magnetic bubble pattern is seen, it is easy to observe that the diameter of the magnetic bubble becomes larger and the distance between magnetic bubbles forming the magnetic bubble lattice becomes smaller. However, the distance with which the magnetic bubbles are free from a translational force is larger than 3d, where d is the diameter of the magnetic bubble. In the present invention, the magnetic bubbles forming the magnetic bubble pattern can be expanded for the sake of observation thereof, by the current flowing through the conductive segments patterns A and B — that is, when the currents flowing through the conductive segments patterns A and B are of as same direction as that of the current shown in FIG. 9 and are 0.5 amperes, the magnetic fields; $H_A$, $H_B$, and $H_C$ of overlapped portions $A_1$, $B_1$ and $C_1$ respectively, as shown in FIG. 8 are $+16$ Oe, $-41$ Oe and $+16$ Oe, respectively. The magnetic field in the portions where the narrow pitch portions of the conductive segments patterns A and B overlap has, of course, a plus direction. Since the magnetic field in the portions $B_1$ alone decrease the bias field $H_{bias}$ whose direction is plus, the magnetic bubbles forming the magnetic bubble pattern and existing in the portions $B_1$ are accordingly expanded therein.

The magnetic bubble pattern can be extinguished by superimposing on the bias magnetic field a further magnetic field which exceeds the magnetic bubble collapse field $H_{co}$. However, the magnetization of the magnetic thin film should not be saturated. That is, the seed bubbles should remain. In this connection, when four dots of highly permeable magnetic material (e.g., Ni-Fe alloy) are established in either side of the magnetic thin film and when seed bubbles exist within the four dots, the magnetic bubble collapse field will increase by a few Oersteds, as aforedescribed to effect bubble extinction. Therefore, by superimposing on the bias magnetic field $H_{bias}$ an incremental magnetic field $\Delta H$, the magnetic bubbles forming the magnetic bubble pattern will collapse but the seed bubbles remain. Thus, the seed bubbles are preserved and the magnetic bubble pattern is eliminated.

As will be understood from the foregoing, the conversion element of the present invention is useful in producing a magnetic bubble matrix without providing any specific magnetic bubble generating circuit, so that it is not necessary to successively propagate magnetic bubbles produced by a generator by means of a propagation channel. Further, it is possible to collectively and simultaneously produce letters or images when the number of sets of conductive segment patterns is increased and each set which consists of segment patterns $X_1 - X_7$ and $Y_1 - Y_7$ is independently operated. Further, the apparatus used with the element may be simplified and the reduction of converting time may be attained.

What is claimed is:

1. A conversion element comprising
   a thin plate capable of having magnetic bubbles formed therein; and
   at least two conductive segment patterns disposed adjacent said thin plate, each pattern comprising a plurality of conductive segments, each conductive segment including switching means therein and having outward and return lines parallel to each other, said plurality of conductive segments of each conductive segment pattern being aligned parallel to one another so that the space between any two adjacent conductive segments thereof is smaller than the space between said outward and return lines, and said two conductive segment patterns being disposed with respect to one another so as to form a lattice shape on said thin film.

2. A conversion element as in claim 1 where said two conductive segment patterns are disposed on opposite sides of said thin plate.

3. A conversion system comprising a thin plate capable of having magnetic bubbles formed therein; and at least two conductive segment patterns disposed adjacent said thin plate, each pattern comprising a plurality of conductive segments, each conductive segment including switching means therein and having outward and return lines parallel to each other, said plurality of conductive segments of each conductive segment pattern being aligned parallel to one another so that the space between any two adjacent conductive segments thereof is smaller than the space between said outward and return lines, and said two conductive segment patterns being disposed with respect to one another so as to form a lattice shape on said thin film;

means for establishing a magnetic bubble matrix in said thin plate, said magnetic bubbles occurring where said conductive segments overlap said last-mentioned means including, means for directing a bias magnetic field, $H_{bias}$, onto said thin plate to stabilize said magnetic bubble matrix;

selective extinguishing means for selectively extinguishing at least one of said magnetic bubbles including means for actuating at least one of the switching means associated with one of said two conductive segment patterns and at least one of the switching means associated with the other of said two conductive segment patterns where both actuated switching means are respectively in the conductive segments which overlap said one magnetic bubble; and said selective extinguishing means including current sources connected to said switching means so that upon said actuation of both said switching means, the magnetic field at said one magnetic bubble is sufficient to effect the extinction thereof.

4. A conversion system as in claim 3 where a first magnetic field associated with a first current through said one conductive segment pattern is $H_{cs}$ and the cumulative magnetic field resulting from said first current and a second current through said other conductive segment is $\alpha H_{cs}$, said system including means for establishing $$H_{cs} + H_{bias} < H_{\infty} - \alpha H_{cs} + H_{bias}$$

where $\alpha < 1$ and $H_{\infty}$ is the magnetic field required to extinguish said one bubble.

5. A conversion system as in claim 4 wherein $\alpha = 2$.

* * * * *